United States Patent
Padukone et al.

(10) Patent No.: US 7,271,753 B1
(45) Date of Patent: Sep. 18, 2007

(54) CALIBRATION OF ANALOG FRONT END FOR GAIN SENSITIVE MEASUREMENTS

(75) Inventors: Pradeep Padukone, San Jose, CA (US); Bin Liu, San Jose, CA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 11/436,824

(22) Filed: May 18, 2006

Related U.S. Application Data

(60) Provisional application No. 60/759,765, filed on Jan. 18, 2006.

(51) Int. Cl.
*H03M 1/62* (2006.01)
(52) U.S. Cl. ...................... 341/139; 341/155
(58) Field of Classification Search ............... 341/139, 341/120, 118, 155; 360/31
See application file for complete search history.

(56) References Cited

U.S. PATENT DOCUMENTS 6,222,375 B1 * 4/2001 Fitzpatrick et al. ......... 324/601
6,256,158 B1 * 7/2001 Brown et al. ................. 360/31
7,075,748 B2 * 7/2006 White et al. ............. 360/78.05
7,113,355 B2 * 9/2006 Hidaka ........................ 360/31

* cited by examiner

*Primary Examiner*—Brian Young
(74) *Attorney, Agent, or Firm*—Myers Bigel Sibley & Sajovec, P.A.

(57) ABSTRACT

Methods of calibrating an analog front end (AFE) of a read/write channel include measuring a first magnitude of a test signal, measuring a second magnitude of an output signal of the AFE generated in response to the test signal, and comparing the first magnitude and the second magnitude to generate a measure of a gain of the AFE at a frequency of the test signal. A data storage device includes a read/write head configured to generate an analog input signal, an AFE coupled to the read/write head and configured to amplify and filter the analog input signal, a test signal generator configured to generate a test signal having a frequency substantially equal to a fundamental frequency of the analog input signal or any of its harmonics, and an attenuator coupled between the test signal generator and the AFE.

23 Claims, 4 Drawing Sheets

CALIBRATION OF ANALOG FRONT END FOR GAIN SENSITIVE MEASUREMENTS

RELATED APPLICATION

This application claims the benefit of and priority to U.S. Provisional Patent Application No. 60/759,765 entitled "Calibration of Channel Analog Front End for Gain Sensitive Measurements," filed Jan. 18, 2006, the disclosure of which is hereby incorporated herein by reference as if set forth in its entirety.

FIELD OF THE INVENTION

The present invention generally relates to digital data storage devices and, more particularly, to methods and apparatus for calibrating the analog front end of a disk drive read channel.

BACKGROUND

Disk drives are digital data storage devices that can store and retrieve large amounts of data in a fast and efficient manner. A typical disk drive includes a plurality of magnetic recording disks that are mounted to a rotatable hub of a spindle motor and rotated at a high speed. An array of read/write heads is disposed adjacent to surfaces of the disks to transfer data between the disks and a host computer. The transducers can be radially positioned over the disks by a rotary actuator and a closed loop, digital servo system, and can fly proximate the surfaces of the disks upon air bearings.

A plurality of nominally concentric tracks can be defined on each disk surface. A preamp and driver circuit generates write currents that are used by the transducer to selectively magnetize the tracks during a data write operation and amplifies read signals detected by the transducer from the selective magnetization of the tracks during a data read operation. A read/write channel and interface circuit are connected to the preamp and driver circuit to transfer the data between the disks and the host computer.

During a read operation, analog electric signals are induced in a read transducer as it travels above the surface of the disk. These input signals are filtered and amplified by an analog front end (AFE) circuit in the read/write channel. Information in the input signals is extracted by the read/write channel and provided to a data controller. In addition to containing information relating to the data stored on the disk, the input signals may also contain information relating to the operation of the disk drive. For example, changes in the flying height of the read/write head may cause characteristic changes in the waveform of the input signals. Thus, by examining certain characteristics of the input signals, a disk drive may determine if a read/write head is flying too low or too high.

For head flying height measurements, the input signal is the readback signal from the head for a known magnetic pattern written in the media. An example of the input signal is the single tone pattern, which includes a fixed number of magnetizations in one direction, followed by another fixed number of magnetization in the other direction. The resultant readback signal can be decomposed to the summation of (1) a constant, also known as the DC content;

(2) a sinusoidal signal with the same frequency of the magnetization pattern, also known as the fundamental frequency component; and (3) sinusoidal signals whose frequencies are the multiples of the fundamental frequency, also known as the harmonics.

By measuring the signal components at the read head output, the response of the head/media at the particular frequencies may be determined. A typical input signal has the same number of the magnetizations in each direction. There are no DC contents or harmonics whose frequencies are even multiples of the fundamental frequency.

Changes in the flying height of a read/write head may be manifested in the time domain by a change in the pulse width of an input signal. For example, the pulse width may be relatively narrow when the read/write head is flying close to the disk surface, and the pulse width may be relatively wide when the read/write head is flying farther away from the disk surface.

Analysis of the input signal waveform may be more conveniently and/or accurately performed in the frequency domain. In particular, the ratio of the first and third harmonic components of the input signal may be used to determine the flying height of a read/write head. The magnitudes of the first and third harmonic components of the input signal may be measured, for example, using a harmonic sensor at the output of the AFE circuit. However, since the input signal is filtered and amplified by the AFE circuit, the magnitude measurements may be affected by changes in the gain of the AFE circuit. Thus, changes in the magnitude measurements may be a result of changes in the flying height of the read/write head or by changes in the gain of the AFE circuit. The gain of the analog front end circuit may be affected by environmental conditions, such as variations in environmental temperature and/or changes in supply voltage, which may be uncorrelated to changes in the underlying input signal.

Calibration of the DC gain of an analog front end may be performed using an environmentally stable reference voltage, such as a bandgap reference voltage. However, the DC gain of the analog front end may respond to environmental changes differently from the gain of the analog front end at frequencies of interest.

Calibration of the AC gain of an analog front end may be performed using an internal calibration square wave signal having an amplitude set with reference to an internal bandgap reference voltage. However, calibration using a square wave signal may have a number of drawbacks. For example, a square wave may include frequency components above the Nyquist frequency that fold back into the signal when it is sampled by an analog to digital converter, and that may interfere with the gain measurements. In addition, the accuracy and stability of the circuit used to convert the digital square wave to a reference square wave signal having an amplitude referenced to a bandgap reference voltage may affect the measurement results.

SUMMARY

Methods of calibrating an analog front end of a read/write channel of a magnetic data storage device according to some embodiments of the invention include measuring a first magnitude of a test signal, measuring a second magnitude of an output signal of the analog front end generated in response to the test signal, and comparing the first magnitude and the second magnitude to generate a measure of a gain of the analog front end at a frequency of the test signal.

Measuring the first magnitude may include filtering the test signal and measuring the filtered test signal using a harmonic sensor, and measuring the second magnitude may include filtering the output signal and measuring the filtered output signal using the harmonic sensor.

The methods may further include converting the test signal and the output signal to a digital test signal and a digital output signal, respectively, using one or more analog to digital converters.

The methods may further include generating the test signal by filtering a square wave signal. Filtering the square wave signal may include filtering the square wave signal with a low pass filter having a cutoff frequency selected to attenuate frequencies above a fundamental frequency of the square wave signal.

Generating the test signal may include generating a first square wave signal having a fundamental frequency Fs and dividing the frequency of the first square wave signal by a divisor n to produce a second square wave signal having a fundamental frequency Fs/n.

The fundamental frequency of the second square wave signal may be substantially equal to a fundamental frequency of an input signal provided to the analog front end. The fundamental frequency of the second square wave signal may be substantially equal to a harmonic frequency of an input signal provided to the analog front end.

The methods may further include attenuating the test signal, and applying the test signal to the analog front end may include applying the attenuated test signal to the analog front end. Attenuating the test signal may include attenuating the test signal by an amount that is sufficient so that a signal output by the analog front end in response to the attenuated test signal will have a dynamic range substantially equal to an input range of an analog to digital converter coupled at an output of the analog front end. The test signal may have a dynamic range substantially equal to the input range of the analog to digital converter.

The methods may further include measuring a third magnitude of a second test signal having a second frequency that may be a harmonic of the first frequency, measuring a fourth magnitude of an output signal of the analog front end generated in response to the second test signal, and comparing the third magnitude and the fourth magnitude to generate a measure of a gain of the analog front end at the second frequency.

The methods may further include adjusting a measurement of a head flying height based on a detected change in the gain of the analog front end at the first frequency and/or the second frequency.

A data storage device according to some embodiments of the invention includes a read/write head configured to generate an analog input signal in response to information stored on a storage medium, and an analog front end coupled to the read/write head and configured to amplify and filter the analog input signal. The device further includes a test signal generator configured to generate a test signal having a frequency substantially equal to a fundamental frequency of the analog input signal, and an attenuator coupled between an output of the test signal generator and an input of the analog front end.

The attenuator and the read/write head may be coupled to the analog front end through a first multiplexer.

The device may further include an analog to digital converter coupled to an output of the analog front end. The test signal generator and the analog front end may be coupled to the analog to digital converter through a second multiplexer.

The attenuator may be configured to attenuate the test signal by an amount such that a signal output by the analog front end in response to the attenuated test signal will have a dynamic range substantially equal to an input range of the analog to digital converter, and the test signal generator may be configured to generate the test signal to have a dynamic range substantially equal to an input range of the analog to digital converter.

The analog front end and the test signal generator may be coupled to the analog to digital converter through a second multiplexer.

The test signal generator may include a clock synthesizer configured to generate a square wave signal, and a low pass filter having a cutoff frequency selected to attenuate frequencies above a fundamental frequency of the square wave signal. The test signal generator may further include a programmable frequency divider coupled to the clock synthesizer and configured to divide a frequency of the square wave signal.

A disk drive according to some embodiments of the invention includes a magnetic data storage disk, a read/write head configured to generate an analog input signal in response to information stored on the data storage disk, an analog front end coupled to the read/write head and configured to amplify and filter the analog input signal, a test signal generator configured to generate a test signal having a frequency that may be substantially equal to a fundamental frequency of the analog input signal, and an attenuator coupled between an output of the test signal generator and an input of the analog front end.

The disk drive may further include a harmonic sensor configured to measure a first magnitude of the test signal and a second magnitude of an output of the analog front end in response to the test signal, and a controller configured to generate a measure of a gain of the analog front end at a frequency of the test signal by comparing the first magnitude and the second magnitude.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

It also will be understood that, as used herein, the term "comprising" or "comprises" is open-ended, and includes one or more stated elements, steps and/or functions without precluding one or more unstated elements, steps and/or functions. As used herein the term "and/or" includes any and all combinations of one or more of the associated listed items. Similarly, a list of items separated by the symbol "/" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The present invention may be embodied as apparatus, methods, and/or computer program products. Accordingly, the present invention may be embodied in hardware and/or in software (including firmware, resident software, microcode, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device. The term "signal" may take the form of a continuous waveform and/or discrete value(s), such as digital value(s) in a memory or register.

The present invention is described below with reference to block diagrams and/or operational illustrations of apparatus, methods, and computer program products according to embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Figure 1:
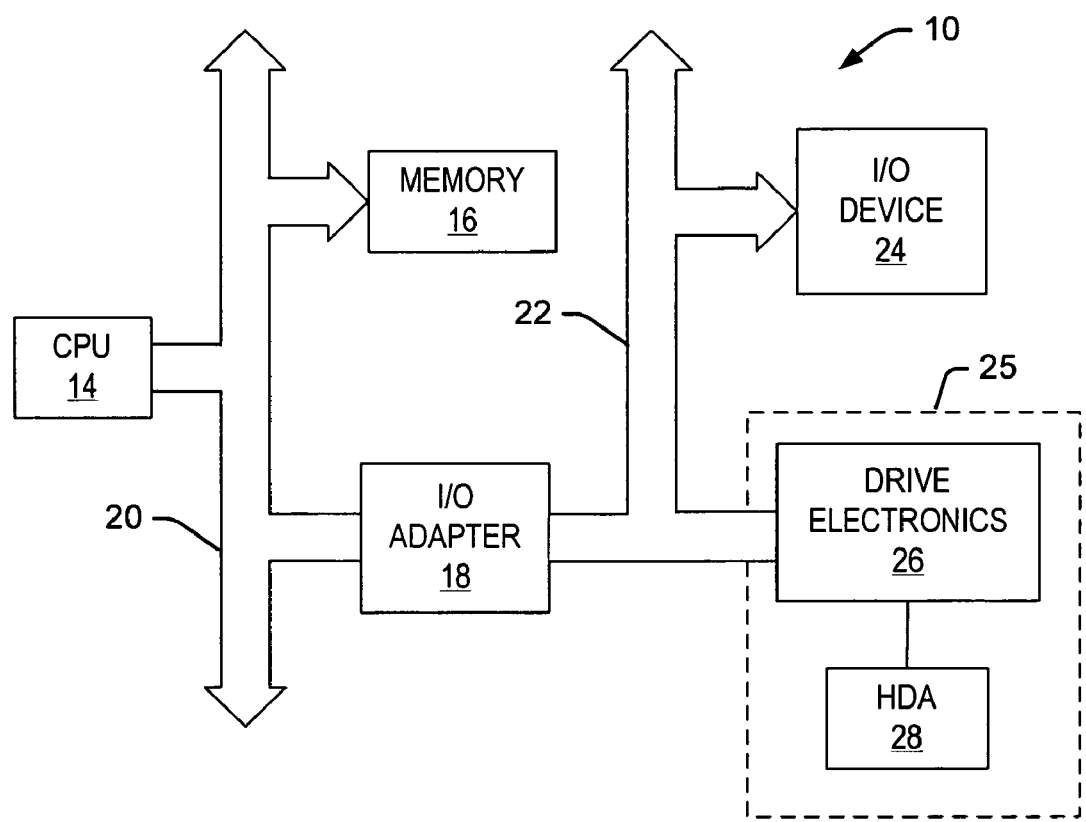
FIG. 1 is a block diagram of an exemplary computer system that includes a disk drive.

Referring to FIG. 1, an exemplary computer system 10 is shown that includes a central processing unit ("CPU") 14, a main memory 16, and I/O bus adapter 18, all interconnected by a system bus 20. Coupled to the I/O bus adapter 18 is I/O bus 22, that may be, for example, a small computer system interconnect (SCSI) bus, firewire bus, and/or a universal serial bus. The I/O bus 22 supports various peripheral devices 24 and a data storage unit such as a disk drive 25. The disk drive 25 includes drive electronics 26 and a head disk assembly 28 ("HDA").

Figure 2:
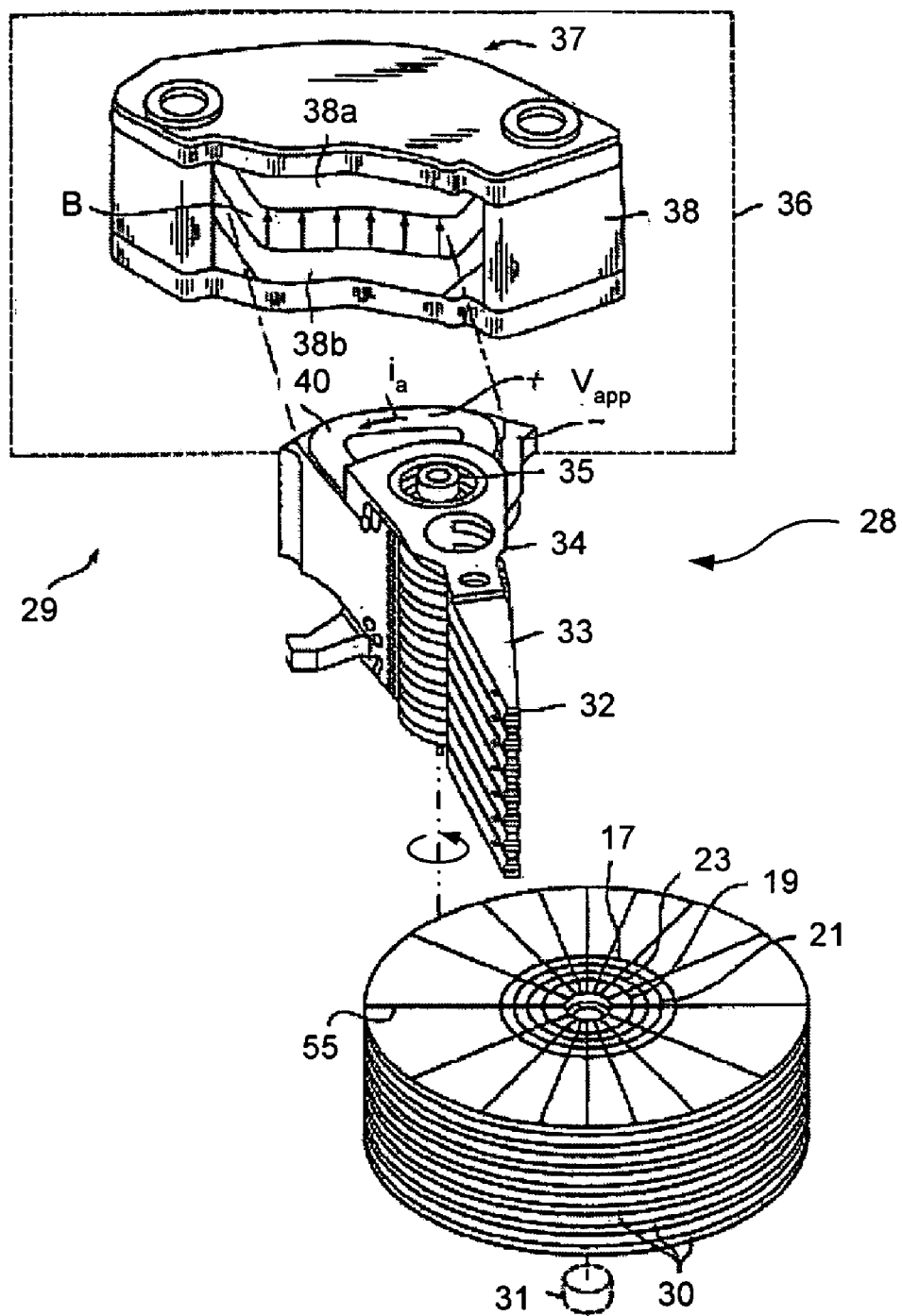
FIG. 2 is a diagram of an exemplary head disk assembly of the disk drive.

Referring to FIG. 2, an exemplary embodiment of the HDA 28 of FIG. 1 is shown that includes an actuator 29 and disks 30 that can be rotated by a spindle motor 31. Data can be stored on the disks 30 in concentric circular data tracks 17. The data can be written and read from the disks 30 via magnetic transducers 32 which are attached to flexible load beams 33 extending from actuator arms 34. The actuator arms 34 pivot about point 35 to move the load beams 33 in a radial direction over the storage surfaces of the disks 30 from an initial track 19 towards a target track 21 shown in FIG. 2 by example. At the target track 21, the magnetic transducers 32 can read from and/or write data on the disks 30. A motor 36 controls the radial movement of the actuator arms 34 in response to an input actuator current $i_a$. Although the disks 30 are described as magnetic disks for purposes of illustration, the disks 30 may alternatively be optical disks or any other type of storage disk which can have data storage tracks defined on one or both of its storage surfaces.

The exemplary motor 36 can include a magnet 37 containing two plates 38a, 38b coupled together via a pair of sidewalls to form a flat toroidal shaped member 38. A wire coil 40 attached to the actuator arms 34 is disposed between the two plates 38a and 38b. The magnet 37 may generate a constant magnetic field B between the plates 38a and 38b. When the input actuator current $i_a$ is passed through the coil 40 disposed in the magnetic field B, a torque is produced on the actuator arms 34 resulting in radial motion of the arms 34 about a pivot point 35. The polarity of the input actuator current $i_a$ determines the direction of the force applied to the actuator arms 34.

Figure 3:
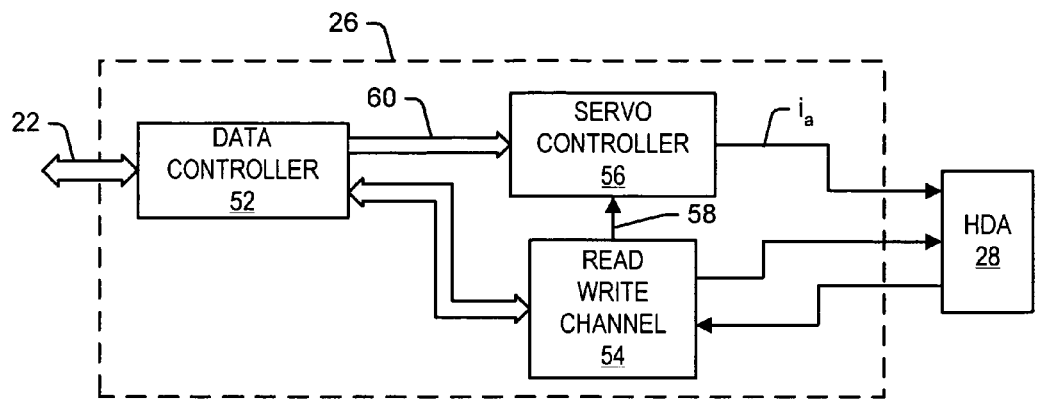
FIG. 3 is a block diagram of the drive electronics of the disk drive that is configured according to some embodiments of the present invention.

Referring to FIG. 3, the drive electronics 26 (FIG. 1) includes a data controller 52, a read/write channel 54, and a servo controller 56. A data transfer initiated by the CPU 14 to the disk drive 25 may involve, for example, a DMA transfer of data from the memory 16 onto the system bus 20 (FIG. 1). Data from the system bus 20 are transferred by the I/O adapter 18 onto the I/O bus 22. The data are read from the I/O bus 22 by the data controller 52, which formats the data into blocks with the appropriate header information and transfers the digital data to the read/write channel 54. The read/write channel 54 can operate in a conventional manner to convert data between the digital form used by the data controller 52 and the analog form used by the transducers 32. For the transfer from the CPU 14 to the HDA 28, the read/write channel 54 converts the data to an analog form suitable for writing by a transducer 32 to the HDA 28. The read/write channel 54 also provides servo positional information read from the HDA 28 to the servo controller 56 on lines 58. For example, the concentric data tracks 17 on the storage surface of a data disk 30 can be broken up and divided into segments by a multiplicity of regularly spaced apart embedded servo sectors 55 (FIG. 2). Each servo sector 55 can include transducer location information such as a track identification field and data block address, for identifying the track and data block, and burst fields to provide servo fine location information. The transducer location information can be used to detect the location of the transducer 32 in relation to that track and data block within the track. The transducer location information is induced into the transducer 32, converted from analog signals to digital data in the read/write channel 54, and transferred to the servo controller 56. The servo controller 56 can use the transducer location information for performing seek and tracking operations of the transducer 32 over the disk tracks 17.

The data controller 52 also provides data that identifies the target track location and the addressed data block on lines 60 to the servo controller 56. The servo controller 56 generates a current command, which is a voltage signal that is converted into the input actuator current $i_a$, and provided to the actuator 29 to move the transducer 32 radially across the disk 30.

Figure 4:
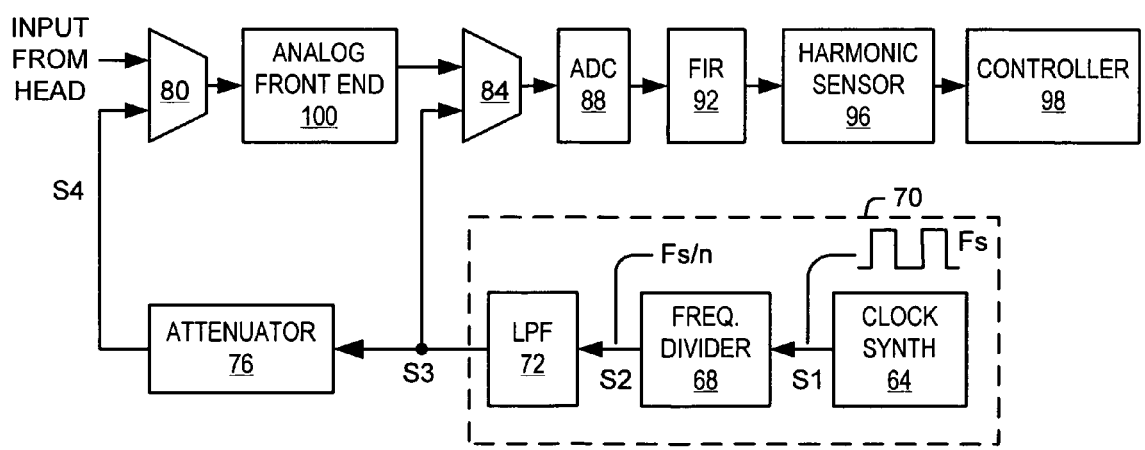
FIG. 4 is a block diagram of an analog front end including a calibration circuit and methods according to some embodiments of the present invention.

FIG. 4 is a block diagram illustrating methods and systems for calibrating a channel analog front end ("AFE") 100. As shown therein, signals from the read/write transducer ("head") 32 are provided to the AFE 100 through a first multiplexer 80. The input signals are filtered and amplified by the AFE 100, and are then converted into digital signals by an analog to digital converter ("ADC") 88, which receives the signal through a second multiplexer 84. The digitized input signal is then filtered using a digital FIR filter 92. A harmonic sensor 96 receives the filtered input signal and detects a level of harmonic components of the input signal. As used herein, a "harmonic sensor" includes any devices, circuits and/or firmware algorithms capable of performing frequency analysis on a signal, for example, by discrete time Fourier transform analysis. The sensor output is provided to a controller 98, which may analyze the sensor output to obtain information about the operation of the disk drive. As discussed above, by analyzing a ratio of the first and third harmonic components of the input signal, the disk controller may determine if the read/write head 32 is flying too high or too low relative to the surface of the disk 30. The controller 98 may also control operations of certain elements illustrated in FIG. 4. For example, the controller 98 may control the operation of the first and second multiplexers 80, 84, as well as the programmable frequency divider 68 and the low pass filter 72 in order to apply appropriate signals to the ADC 88 for measurement.

However, as discussed above, changes in the gain of the AFE 100 may affect the level of the harmonic components of the input signal as measured by the harmonic sensor 96. In order to account for the gain of the AFE 100, some embodiments of the invention provide systems and/or methods for calibrating the gain of the analog front end 100. As shown in FIG. 4, a test signal generator 70 includes a clock synthesizer 64, a programmable frequency divider 68 and a low pass filter 72. The clock synthesizer 64 generates a square wave S1 having a fundamental frequency of Fs. The square wave S1 generated by the clock synthesizer 64 may have a duty cycle of about 50%, although other duty cycles may be employed. The frequency of the square wave S1 is divided by the programmable frequency divider 68 to produce a square wave test signal S2 having a fundamental frequency of Fs/n. By appropriate selection of the divisor n, a square wave test signal S2 having a fundamental frequency substantially equal to the fundamental frequency of the input signal, or a harmonic of the fundamental frequency of the input signal, may be synthesized. The square wave test signal S2 is then filtered using the low pass filter 72, which may have a programmable cut-off frequency. The low pass filter 72 may be implemented in the continuous time domain and/or as a combination of filters in the continuous time domain and the discrete time domain.

The cut-off frequency of the low pass filter 72 may be selected such that only the fundamental frequency component of the square wave test signal S2 is in the passband of the filter 72. Accordingly, a sinusoidal test signal S3 is output by the low pass filter 72. In the sinusoidal test signal S3, frequency components above the fundamental frequency of the square wave test signal S2 may be significantly attenuated, which may reduce and/or eliminate the problem of aliasing (frequency fold-back) when the sinusoidal test signal S3 is digitized.

Further, by passing only the fundamental frequency component of the square wave test signal S2, the magnitude of the sinusoidal test signal S3 may be almost constant across the frequency range of interest. Therefore, the gain of the low pass filter 72 may be selected such that the amplitude of the sinusoidal test signal S3 spans a substantial portion of the input range of the ADC 88, which may reduce and/or minimize quantization noise in the calibration measurements.

The sinusoidal test signal S3 may be attenuated by an attenuator 76 in order to generate a test signal S4 having a dynamic range that is suitable for processing by the AFE 100. The attenuator may be implemented as a voltage divider, for example. In some embodiments, the gain $k_{ATT}$ of the attenuator 76 need not be known precisely, for the reasons discussed below. However, the gain $k_{ATT}$ of the attenuator 76 should be relatively insensitive to environmental changes. This requirement can be easily satisfied in an integrated circuit where the ratios of component values are less sensitive to the environment than the absolute values of the component values. In brief, since a calibration system and/or method according to some embodiments of the invention may be used to detect changes in the gain of the AFE 100, the actual gain $k_{ATT}$ of the attenuator 76 may not be important, provided it remains relatively stable over a range of environmental conditions.

Because the AFE 100 performs amplification and filtering, the AFE 100 and the ADC 88 typically have different input signal ranges. As discussed above, the gain of the low pass filter 72 may be selected so that the magnitude of the test signal S3 extends over a substantial portion of the input range of the ADC 88. The attenuation $k_{ATT}$ of the attenuator is selected such that the output of the AFE 100 in response to the attenuated test signal S4 spans a substantial portion of the input range of the ADC 88.

According to some embodiments of the invention, the harmonic sensor 96 may be used to measure the magnitude of the signals having fundamental frequencies substantially equal to the first and third harmonics of the input signal. The magnitude of a test signal is measured after passing through the attenuator 76 and the AFE 100 on one hand, and after bypassing the attenuator 76 and the AFE 100 on the other hand. The ratio of the two measurements provides an indication of the overall gain of the AFE 100 and the attenuator 76. By selecting appropriate values for the frequency divider 68 and performing such measurements over time, changes in the overall gain of the AFE 100 and the attenuator 76 may be identified and tracked at the fundamental and third harmonic frequencies. However, since the gain of the attenuator 76 ($k_{ATT}$) can be made relatively insensitive to environmental changes, any changes in the overall gain can be attributed to the gain $k_{AFE}$ of the AFE 100.

That is, by measuring the gain of the AFE 100 and attenuator 76 at the frequencies of interest when the read channel is not processing any data from the drive, systems and/or methods according to the invention may determine how the gain of the AFE 100 is changing at frequencies of interest due to environmental changes such as voltage supply or temperature changes. Such changes in the gain of the AFE 100 may be factored into calculations involving signal gain, such as head fly height calculations, in order to provide more accurate results.

Figure 5:
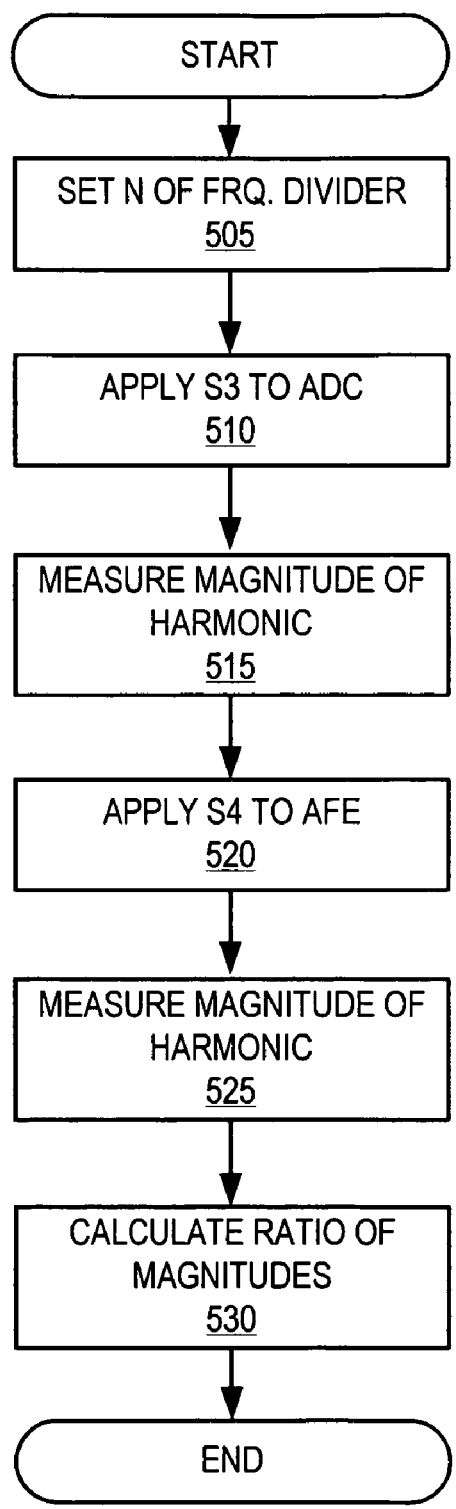
FIG. 5 is a flowchart illustrating operations for calibrating a channel analog front end according to some embodiments of the invention.

Operations for calibrating an AFE 100 according to some embodiments of the invention are illustrated in FIGS. 4 and 5. As shown therein, the programmable frequency divider is programmed with a divisor n to produce a square wave signal S2 having a fundamental frequency of Fs/n that is the same as or nearly equal to the fundamental frequency of the input signal from the read/write head 32 (block 505). For example, the programmable frequency divider 68 may be set with n=12 to generate a square wave having a fundamental frequency of Fs/12. The square wave signal S2 is filtered by the low pass filter 72, which is configured to have a cutoff frequency such that the filtered sinusoidal test signal S3 output by the low pass filter 72 includes mostly the fundamental frequency Fs/12 of the square wave signal S2. The second multiplexer 84 is set to apply the sinusoidal test signal S3 to the ADC 88, which converts the sinusoidal test signal S3 to a digital signal (block 510). The magnitude of the sinusoidal test signal S3 is measured by the harmonic sensor, and may be recorded as A1 (block 515).

Next, the first multiplexer 80 is set to apply the sinusoidal test signal S4, which has been attenuated by the attenuator 76, to the AFE 100 (block 520). The second multiplexer 84 is set to apply the output of the AFE 100 to the ADC 88. The magnitude of the resulting signal is measured by the harmonic sensor 96, and may be recorded as A2 (block 525). The ratio of the two readings A2/A1 is then calculated (block 530). This ratio is equal to $k_{ATT}*k_{AFE}$, where $k_{ATT}$ is the gain of the attenuator 76, and $k_{AFE}$ is the gain of the AFE 100. Thus, the ratio of the two readings A2/A1 provides a measure of the overall gain of the AFE 100 and the attenuator 76 at the fundamental frequency Fs/12.

The divisor n of the programmable frequency divider 68 is then set to 4, so that the sinusoidal test signal output by the low pass filter 72 has a frequency equal to the third harmonic of the input signal. The cutoff frequency of the low pass filter 72 is readjusted so that the frequency Fs/4 is in the passband of the filter, and the operations of blocks 510 to 530 are then repeated to obtain readings A3 and A4 for the magnitudes of the signals at the outputs of the low pass filter 72 and the AFE 100, respectively, at the third harmonic frequency. The ratio of the two readings A4/A3 provides a measure of the overall gain of the AFE 100 and the attenuator 76 at the third harmonic frequency Fs/4.

The ratios A2/A1 and A4/A3 may be measured from time to time to determine if the gain $k_{AFE}*k_{ATT}$ of the AFE 100 and the attenuator 76 is changing over time, for example, due to environmental changes at a frequency of interest. Since environmental changes tend to occur relatively slowly compared to the processing time required to take the measurements A1-A4, the measurements may be taken close enough together in time that environmental changes may not occur while the measurements are being taken. In addition, since the attenuator 76 can be designed so that it's gain is relatively insensitive to environmental changes, any changes in the overall gain $k_{AFE}*k_{ATT}$ can be attributed to changes in the gain $k_{AFE}$ of the AFE 100.

Since the same signal is applied to both the ADC 88 and the attenuator 76, it will be appreciated that the methods and systems described herein may not require a calibration source with precise and/or stable amplitude control. Moreover, a clock synthesizer such as the clock synthesizer 64 is a conventional component of a disk drive, and may provide a readily available signal source to be used in connection with embodiments of the invention.

For example, although the frequency of the sinusoidal test signal S3 may accurately follow the frequency of the signal output by the clock synthesizer 64, the amplitude of the test signal S3 may not be precisely controlled. However, since the signal may be applied to the ADC 88 both before and after the AFE 100, and a ratio of the resulting magnitudes may be obtained, it may not be necessary to know the exact signal amplitude. Furthermore, while the low pass filter 72 may be subject to changes in the environmental conditions, such changes may be cancelled out when the ratio is taken, since the changes may affect both measurements.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of calibrating an analog front end of a read/write channel of a magnetic data storage device, the method comprising:
   measuring a first magnitude of a test signal;
   measuring a second magnitude of an output signal of the analog front end generated in response to the test signal; and
   comparing the first magnitude and the second magnitude to generate a measure of a gain of the analog front end at a frequency of the test signal.

2. The method of claim 1, wherein measuring the first magnitude comprises filtering the test signal and measuring the filtered test signal using a harmonic sensor, and wherein measuring the second magnitude comprises filtering the output signal and measuring the filtered output signal using the harmonic sensor.

3. The method of claim 2, further comprising converting the test signal and the output signal to a digital test signal and a digital output signal, respectively, using one or more analog to digital converters.

4. The method of claim 1, further comprising generating the test signal by filtering a square wave signal.

5. The method of claim 4, wherein filtering the square wave signal comprises filtering the square wave signal with a low pass filter having a cutoff frequency selected to attenuate frequencies above a fundamental frequency of the square wave signal.

6. The method of claim 4, wherein generating the test signal comprises generating a first square wave signal having a fundamental frequency Fs and dividing the frequency of the first square wave signal by a divisor n to produce a second square wave signal having a fundamental frequency Fs/n.

7. The method of claim 6, wherein the fundamental frequency of the second square wave signal is substantially equal to a fundamental frequency of an input signal provided to the analog front end.

8. The method of claim 6, wherein the fundamental frequency of the second square wave signal is substantially equal to a harmonic frequency of an input signal provided to the analog front end.

9. The method of claim 1, further comprising attenuating the test signal, wherein applying the test signal to the analog front end comprises applying the attenuated test signal to the analog front end.

10. The method of claim 9, wherein attenuating the test signal comprises attenuating the test signal by an amount that is sufficient so that a signal output by the analog front end in response to the attenuated test signal will have a dynamic range substantially equal to an input range of an analog to digital converter coupled at an output of the analog front end.

11. The method of claim 10, wherein the test signal has a dynamic range substantially equal to the input range of the analog to digital converter.

12. The method of claim 1, wherein the test signal comprises a first test signal having a first frequency, the method further comprising:
   measuring a third magnitude of a second test signal having a second frequency that is a harmonic of the first frequency;
   measuring a fourth magnitude of an output signal of the analog front end generated in response to the second test signal; and comparing the third magnitude and the fourth magnitude to generate a measure of a gain of the analog front end at the second frequency.

13. The method of claim 12, further comprising:
adjusting a measurement of a head flying height based on a detected change in the gain of the analog front end at the first frequency and/or the second frequency.

14. A data storage device, comprising:
a read/write head configured to generate an analog input signal in response to information stored on a storage medium;
an analog front end coupled to the read/write head and configured to amplify and filter the analog input signal;
a test signal generator configured to generate a test signal having a frequency that is substantially equal to a fundamental frequency of the analog input signal; and
an attenuator coupled between an output of the test signal generator and an input of the analog front end.

15. The device of claim 14, wherein the attenuator and the read/write head are coupled to the analog front end through a first multiplexer.

16. The device of claim 14, further comprising an analog to digital converter coupled to an output of the analog front end, wherein the test signal generator and the analog front end are coupled to the analog to digital converter through a second multiplexer.

17. The device of claim 16, wherein the attenuator is configured to attenuate the test signal by an amount that is sufficient so that a signal output by the analog front end in response to the attenuated test signal will have a dynamic range substantially equal to an input range of the analog to digital converter.

18. The device of claim 16, wherein the test signal generator is configured to generate the test signal to have a dynamic range substantially equal to an input range of the analog to digital converter.

19. The device of claim 16, wherein the analog front end and the test signal generator are coupled to the analog to digital converter through a second multiplexer.

20. The device of claim 14, wherein the test signal generator comprises a clock synthesizer configured to generate a square wave signal, and a low pass filter having a cutoff frequency selected to attenuate frequencies above a fundamental frequency of the square wave signal.

21. The device of claim 20, wherein the test signal generator further comprises a programmable frequency divider coupled to the clock synthesizer and configured to divide a frequency of the square wave signal.

22. A disk drive, comprising:
a magnetic data storage disk;
a read/write head configured to generate an analog input signal in response to information stored on the data storage disk;
an analog front end coupled to the read/write head and configured to amplify and filter the analog input signal;
a test signal generator configured to generate a test signal having a frequency that is substantially equal to a fundamental frequency of the analog input signal; and
an attenuator coupled between an output of the test signal generator and an input of the analog front end.

23. The disk drive of claim 22, further comprising: a harmonic sensor configured to measure a first magnitude of the test signal and a second magnitude of an output of the analog front end in response to the test signal; and
a controller configured to generate a measure of a gain of the analog front end at a frequency of the test signal by comparing the first magnitude and the second magnitude.

* * * * *